United States Patent
Kumar et al.

(10) Patent No.: US 7,490,279 B1
(45) Date of Patent: Feb. 10, 2009

(54) TEST INTERFACE FOR RANDOM ACCESS MEMORY (RAM) BUILT-IN SELF-TEST (BIST)

(75) Inventors: Rahul Kumar, Bangalore (IN); Partha Ray, Bangalore (IN); Suryanarayana R. Maturi, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 346 days.

(21) Appl. No.: 11/274,664

(22) Filed: Nov. 15, 2005

Related U.S. Application Data

(60) Provisional application No. 60/721,640, filed on Sep. 29, 2005.

(51) Int. Cl.
*G01R 31/281* (2006.01)
(52) U.S. Cl. .................. 714/733; 714/719; 714/738
(58) Field of Classification Search ............ 714/712, 714/733, 718, 719, 738
See application file for complete search history.

(56) References Cited

U.S. PATENT DOCUMENTS

| | | | |
|---|---|---|---|
| 4,513,419 A * | 4/1985 | Small | 714/712 |
| 6,681,359 B1 * | 1/2004 | Au et al. | 714/733 |
| 2005/0210352 A1 * | 9/2005 | Ricchetti et al. | 714/733 |
| 2006/0090105 A1 * | 4/2006 | Woods | 714/718 |

OTHER PUBLICATIONS

B. Nadeau-Dostie et al., "A Serial Interfacing Technique for Built-In and External Testing of Embedded Memories," *IEEE 1989 Custom Integrated Circuits Conference*, vol. CH2671-6 (1989), pp. 22.2.1-22.2.5.

* cited by examiner

*Primary Examiner*—David Ton
(74) *Attorney, Agent, or Firm*—Stallman & Pollock LLP

(57) ABSTRACT

Built-In Self Test (BIST) is a test technique wherein semiconductor integrated circuit devices test themselves during their operation lifetime. BIST techniques do not necessarily require additional hardware; they can be implemented using dedicated software routines. Various BIST algorithms and techniques have been proposed for testing random access memory (RAM) devices. The present invention provides an architecture for the memory-test interface that allows the serial transfer of the test background data from the BIST controller to the interface of the memory-under-test using a single bit with serial-to-parallel data conversion using a shift register in the memory interface. The size of the shift register is equal to the word width of the memory-under-test.

1 Claim, 3 Drawing Sheets

US 7,490,279 B1

TEST INTERFACE FOR RANDOM ACCESS MEMORY (RAM) BUILT-IN SELF-TEST (BIST)

RELATED APPLICATION

This application claim the benefit of U.S. provisional patent application No. 60/721,640, filed on Sep. 29, 2005, which is hereby incorporated by reference in its entirety.

TECHNICAL FIELD

The present invention relates to the testing of semiconductor integrated circuit devices and, in particular, to a low overhead built-in self test (BIST) technique for testing random access memory (RAM).

DESCRIPTION OF THE INVENTION

Built-In Self Test (BIST) is a test method wherein a semiconductor integrated circuit device tests itself periodically during its operational lifetime. According to BIST techniques, when the device comes out of a designated mode, e.g. reset, it executes a dedicated software routine that tests the different hardware modules of the device. Depending upon the test results, the device is either placed in a "safe" state if an error is detected, thereby preventing the execution of critical functions that might cause the entire device to fail, or it is allowed to proceed with execution of its normal applications program if no errors are detected.

BIST algorithms and techniques for testing random access memory devices are well know to persons skilled in the art. Most of these techniques involve the evaluation of all of the bits of each memory word in parallel as it is read. A comparator is typically used for testing each bit of the output data path. Nadeau-Dostie et al., "A Serial Interfacing Technique for Built-In and External Testing of Embedded Memories", IEEE 1989 Custom Integrated Circuits Conference, 1989 IEEE, disclose the design and implementation of a test access method and BIST scheme for embedded static RAMs based upon a serial interfacing technique.

Boundary scan techniques for testing integrated circuits are also well known to those skilled in the art. Boundary scan testing involves embedding special test circuits into the IC chip. These additional circuit modules allow input and output signals to be scanned into and out of the I/O circuits of a device in a serial manner, thereby allowing the device to be tested using a small number of I/O pins. Typically, a scan test architecture includes a boundary cell on each of the circuit's I/O pins, a scan path or "chain" that connects the boundary cells together, a test access port (TAP) for controlling the signals used in the boundary scan test, and a TAP finite state machine (FSM) that controls the states of operation of the boundary scan testing. Under normal circuit operating conditions, the boundary cells allow the normal input and output signals of the device pass through them. However, when the device is place in the "Test" mode, the boundary cells become "active" for capturing the input and output signals. The boundary cells are typically multiplexed shift registers that are placed around the periphery of the chip; hence the name "boundary cells."

The present invention provides an architecture for a memory-test interface that allows serial transfer of the test background data from a BIST controller to the interface of a memory-under-test using a single bit with serial-to-parallel data conversion using a shift register in the memory interface. The size of the shift register is equal to the word width of the memory-under-test. The test interface architecture of the present invention results in low overhead routing and improved performance.

Figure 1:
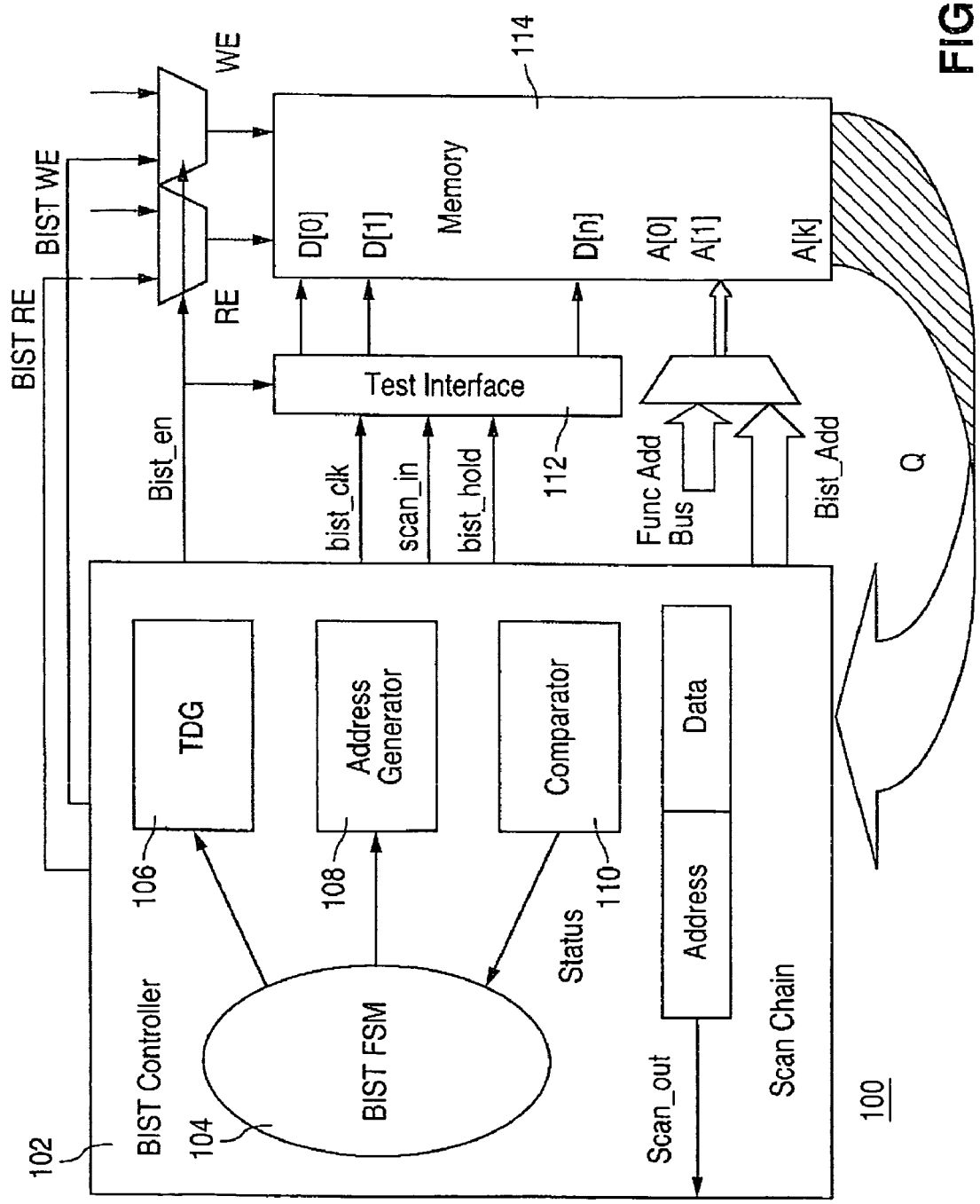
FIG. 1 is a block drawing illustrating an embodiment of a memory BIST system in accordance with the concepts of the present invention.

FIG. 1 shows a block diagram of a BIST system 100 in accordance with the concepts of the present invention. The BIST system 100 comprises a BIST controller 102 that includes a BIST finite state machine (FSM) 104 that is the master module that controls the operation of a test data generator (TDG) 106, an address generator 108 and the test interface 112 with the memory-under-test 114. The BIST controller 102 generates the memory read enable signal BIST_RE and the memory write enable signal BIST_WE, as discussed in greater detail below. In addition to serving as the master control module, the BIST FSM 104 also monitors the output of a comparator 110 and reports errors appropriately.

Figure 2:
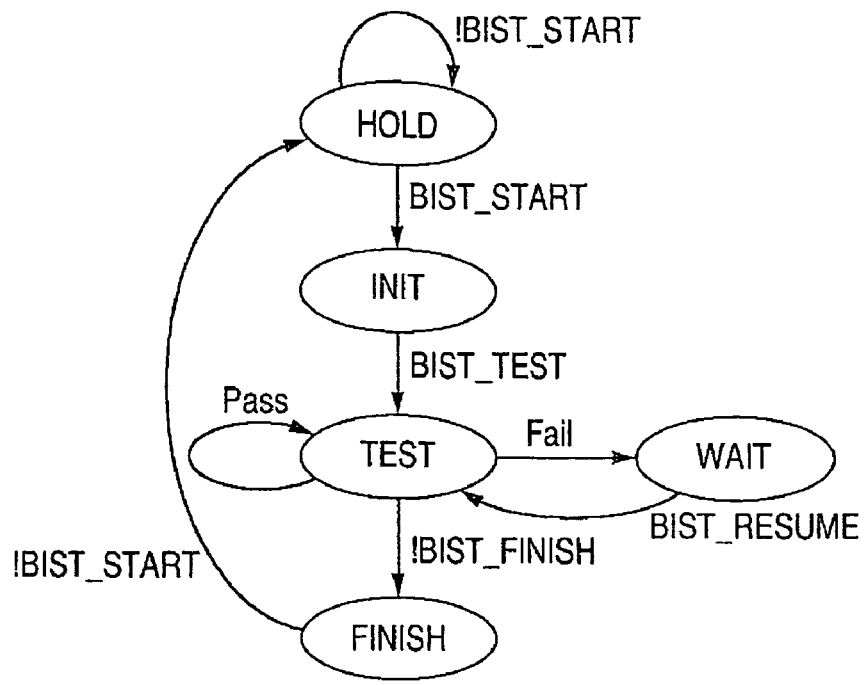
FIG. 2 is a flow chart illustrating the sequence of operations performed by the BIST FSM in the FIG. 1 system.

FIG. 2 provides a diagram that shows the sequence of operations performed by the BIST FSM 104. As shown in FIG. 2, the BIST FSM 104 starts from the HOLD state. The BIST system 100 remains in the HOLD state during the normal functioning of the associated IC device. Once the test access port (TAP) controller (not shown) for the associated scan testing software asserts the BIST_START signal, the BIST FSM 104 moves from the HOLD state to the initialization state INIT.

In the INIT state, all of the flip-flops (test interface FFs, data generator FFs, address Generator FFs, and status signal FF) of the test system 100 are initialized to state ZERO. A BIST_TEST signal is asserted after initialization is completed and the BIST system 100 then moves to the TEST state. In the TEST mode, depending upon whether a read operation or a write operation is to be performed, either the read enable signal BIST_RE or the write enable signal BIST_WE, respectively, is asserted by the BIST controller 102.

For a "write" operation, the test data generator 106 scans the required background pattern into a test interface shift register 112. A counter (not shown) in the test data generator 106 keeps track of the number of bits that have been provided to the test interface shift register 112 and the address generator 108 generates the address of the memory word location in the memory-under-test 114 to be tested. Once the background patterns are scanned in, the BIST enable signal BIST_EN is asserted and the memory word to be tested is filled with the background pattern.

During a "read" operation, the test data generator 106 is put on hold and the BIST read signal BIST_RE is asserted is asserted by the BIST controller 102. As described in greater detail below, the comparator 110 compares the output of the "read" operation with the contents of the test interface register 112 and generates a Pass/Fail signal based upon the results of the comparison. If the output of the comparator 110 is HIGH, then the address and the memory contents are stored in the scan chain and the BIST FSM 104 goes to the WAIT state (see FIG. 2). The scan chain is then scanned out to the associated automatic test equipment (ATE) and the TEST operation resumes, i.e. the BIST_RESUME signal is asserted. Once the final operation of the algorithm is reached, the BIST_FINISH signal is asserted and the BIST FSM 104 moves to the FINISH state (see FIG. 2). An internal counter in the BIST controller 102 keeps track of the number of operations performed.

In the WAIT state, the failure data is loaded in the scan chain. Once the data is stored in the scan chain, the BIST_RESUME signal is asserted and normal test operation continues.

In the FINISH state, the BIST_START signal is de-asserted and the BIST moves to the HOLD state.

Figure 3:
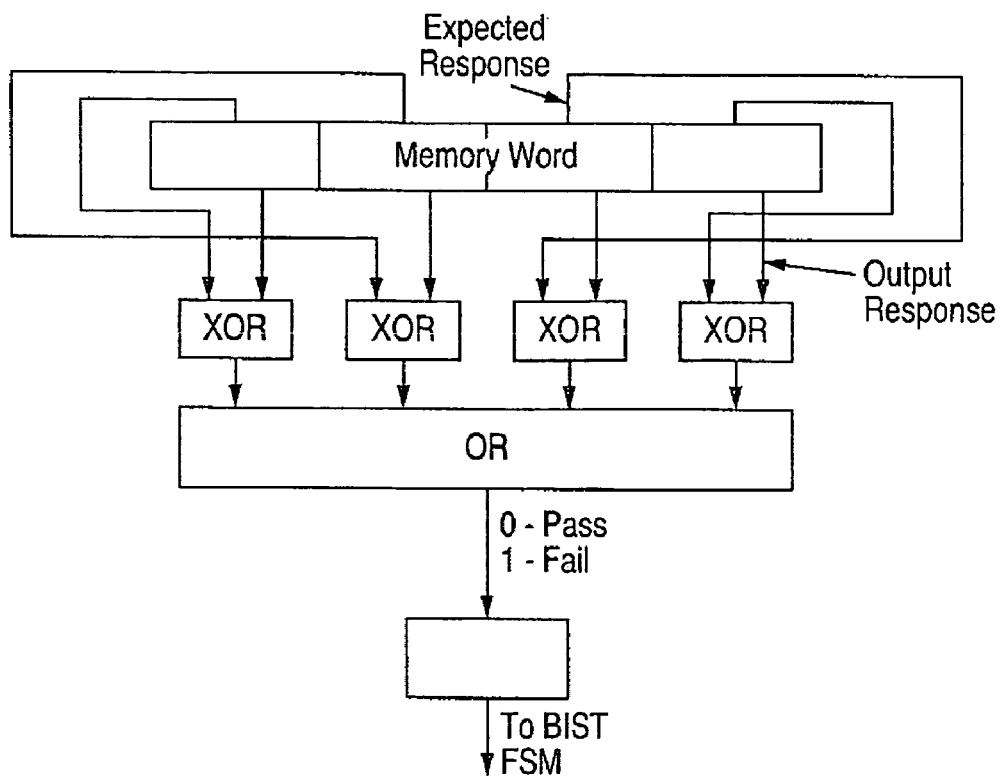
FIG. 3 is a block diagram illustrating a comparator design utilizable in the FIG. 1 system.

As stated above, the purpose of the comparator 110 is to compare the output response of the memory word being tested with the written response and to generate a Pass/Fail signal. For example, if the input written to a 4-bit memory word is 0101 and the output response is 0001, assuming a "stuck-at 0" fault for the second bit location, the comparison should result in a Fail signal. Various implementations of a comparator 110 suitable for this purpose are well known to persons skilled in the art. FIG. 3 shows a 4-bit deterministic comparator design 300 that compares the reference data with the memory word contents. The output of the comparator 300 is latched to provide the BIST FSM 104 with a Pass/Fail status signal, as shown in FIGS. 2 and 3.

Figure 4:
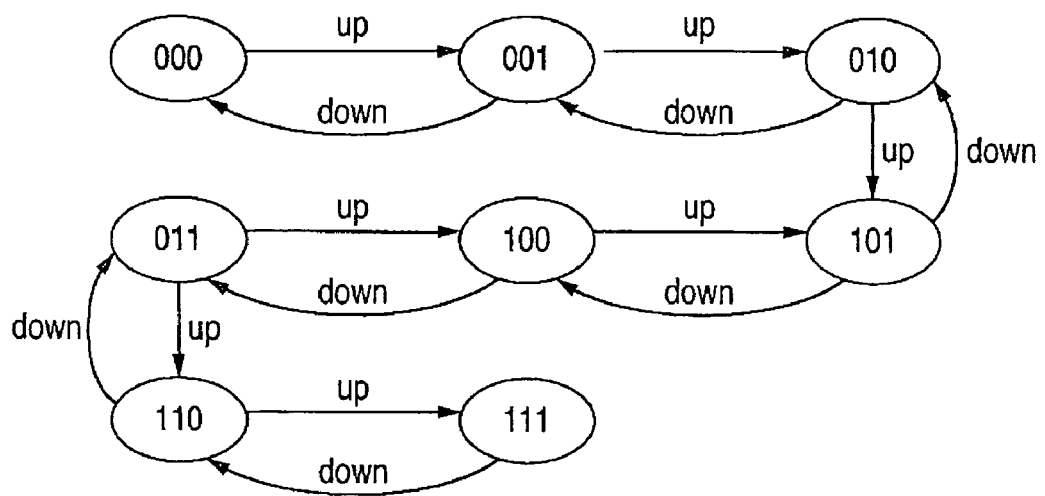
FIG. 4 shows the FSM for a 3-bit address-counter utilizable in the FIG. 1 system.

The design of the address generator finite state machine 108 is dependent upon the complexity of the test algorithm used. It can be viewed as a simple counter, the output of which is the memory address. For example, FIG. 4 shows a 3-bit address counter that counts from 0 to 7 when the "up" signal is asserted and from 7 to 0 when the "down" signal is asserted. The up/down signals are generated depending upon the algorithm sequence. Once the BIST FSM 104 enters the TEST mode, the "up" signal is asserted and the counter is incremented on each clock cycle. After the counter reaches the prescribed number, the "up" signal is de-asserted and the "down" signal is asserted. The FIG. 4 address generator is implemented using counters. Alternately, those skilled in the art will appreciate that linear feedback shift registers (LFSRs) can be used to generate the same sequences.

Similar to address generation, the test data generation is also dependent upon the memory test algorithm. Once the BIST FSM 104 enters the TEST mode, the test data generator 106 is initiated and the test patterns (data background patterns) to be written to the memory words are generated. The test data generator 106 has an internal counter that keeps track of the number of bits to be scanned into the test interface register (TIR) 112. For example, for a 4-bit memory word, the background pattern to be written is 0101, and the counter is incremented from 0-3. If the same pattern is to be written to the next word, then new patterns are not generated and the test pattern stored in the TIR 112 is used to write to the next memory word. This scheme saves time in generating new patterns. The design of the test data generator 106 is closely coupled with the background patterns to be generated. Alternative structures for the test data generators are LFSRs.

The test interface provides a mechanism for routing test patterns to the memory ports. The test interface architecture of the present invention provides serial shifting capability from the test data generator 106 to the memory-under-test 114. The advantage of serially shifting the test data from the test data generator 106 is the reduced overhead of routing data lines from the test data generator 106 to the memory 114.

Figure 5:
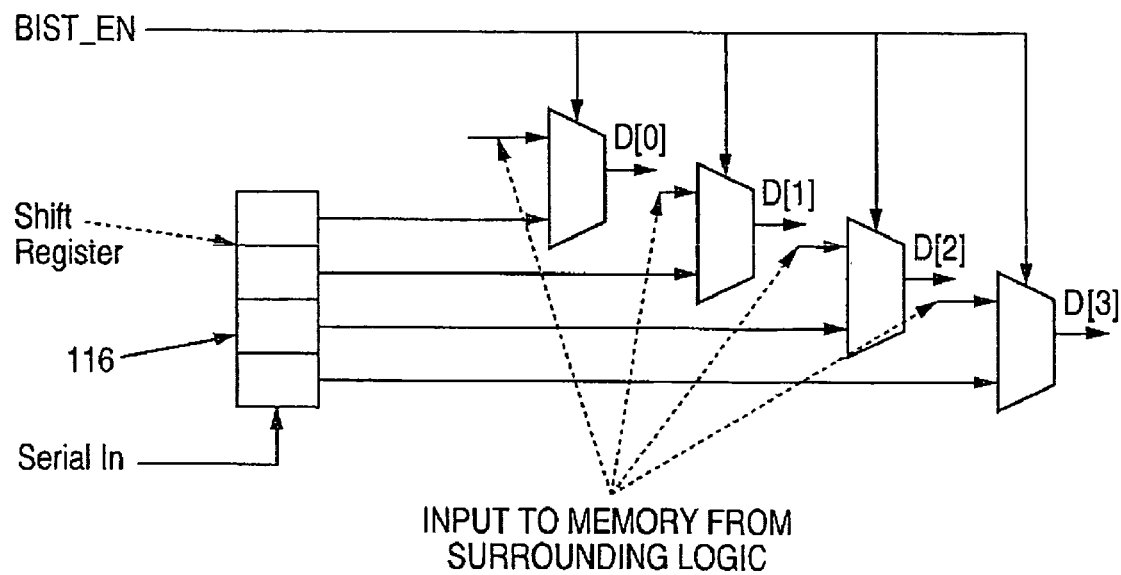
FIG. 5 shows a BIST test interface architecture in accordance with the concepts of the present invention.

FIG. 5 shows an embodiment of test interface architecture 500 in accordance with the concepts of the present invention.

As shown in FIG. 5, the test interface is realized using a shift register (serial-in-parallel-out) 502. The parallel output from the shift register 116 is multiplexed with the data input ports D[0]-D[n] of the memory-under-test 114. As discussed above, the control signals for the memory 114 and for the test interface 112 are generated by the BIST FSM 104. The serial in port is used for loading the shift register 116 with test data words. The multiplexer's BIST_EN signal is used for writing the test data to the addressed memory word in the memory-under-test 114. Data ports D[0-3] in FIG. 5 represent the data-in ports of the memory 114 (see FIG. 1).

As discussed above, and with reference to FIG. 1, when the output of the comparator 110 is asserted high, i.e., a failure occurs in the comparison, the failed memory output is stored in the scan chain, as shown in FIG. 1, and scanned out to the ATE. During this process, the address generator 108, the test data generator 106 and test interface shift register 112 remain in the HOLD state. The number of clock cycles needed to store the failed address and the data in the scan chain is one clock cycle. The time required to scan out the failed data is equal to the width of the scan chain, which is equal to the number of address bits plus the width of the memory word.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A built-in self-test (BIST) system formed as part of an integrated circuit for testing memory circuitry formed as part of the integrated circuit, the memory circuitry including a plurality of memory storage cells, each memory cell including a specified number of storage bits and having a specified address associated therewith, the BIST system comprising:

(a) a test interface shift register having the same specified number of storage bits as said memory storage cells;

(b) a BIST controller that generates write enable signals and read enable signals, the BIST controller including (i) a test pattern generator that responds to a BIST test enable signal by serially loading a test pattern having the specified number of bits into the test interface shift register;

(ii) a counter that counts the number of bits that are being loaded into the test interface shift register and signals the test pattern generator when the specified number of bits have been loaded into the test interface shift register; and (iii) an address generator that generates an address of a specified memory storage cell in the memory circuitry, the test interface shift register being responsive to a write enable signal generated by the BIST controller for serially shifting the test pattern into the specified memory storage cell as contents of the specified memory storage cell;

(c) a comparator, the memory circuitry being responsive to a read enable signal generated by the BIST controller for providing the contents of the specified memory storage cell to the comparator, the comparator comparing the contents of the specified memory storage cell and the test pattern provided to the specified memory storage cell by the test interface shift register, the comparator generating a pass signal if the contents of the specified memory storage cell matches the test pattern.

* * * * *